United States Patent [19]
Leong et al.

[11] Patent Number: 5,598,109
[45] Date of Patent: *Jan. 28, 1997

[54] PROGRAMMABLE LOGIC ARRAY DEVICE WITH GROUPED LOGIC REGIONS AND THREE TYPES OF CONDUCTORS

[75] Inventors: William W. Leong, San Francisco; Richard G. Cliff, Milpitas; Cameron McClintock, Mountain View, all of Calif.

[73] Assignee: Altera Corporation, San Jose, Calif.

[ * ] Notice: The portion of the term of this patent subsequent to Feb. 14, 2015, has been disclaimed.

[21] Appl. No.: 626,513

[22] Filed: Apr. 2, 1996

Related U.S. Application Data

[63] Continuation of Ser. No. 388,300, Feb. 14, 1995, Pat. No. 5,537,057.

[51] Int. Cl.$^6$ .............................................. H03K 19/177
[52] U.S. Cl. ............................................... 326/41; 326/39
[58] Field of Search ................................. 326/39–41, 47; 340/825.83, 825.87

[56] References Cited

U.S. PATENT DOCUMENTS

| | | |
|---|---|---|
| Re. 34,363 | 8/1993 | Freeman . |
| 3,473,160 | 10/1969 | Wahlstrom ........................... 340/172.5 |
| 4,609,986 | 9/1986 | Hartmann et al. ..................... 364/200 |
| 4,617,479 | 10/1986 | Hartmann et al. . |
| 4,642,487 | 2/1987 | Carter . |
| 4,677,318 | 6/1987 | Veenstra . |
| 4,706,216 | 11/1987 | Carter ...................................... 365/94 |
| 4,713,792 | 12/1987 | Hartmann et al. ....................... 364/900 |
| 4,774,421 | 9/1988 | Hartmann et al. . |
| 4,871,930 | 10/1989 | Wong et al. . |
| 4,899,067 | 2/1990 | So et al. . |
| 4,912,342 | 3/1990 | Wong et al. . |
| 4,963,770 | 10/1990 | Keida . |
| 5,121,006 | 6/1992 | Pedersen . |
| 5,208,491 | 5/1993 | Ebeling et al. . |
| 5,212,652 | 5/1993 | Agrawal et al. ........................ 364/489 |
| 5,220,214 | 6/1993 | Pedersen . |
| 5,260,610 | 11/1993 | Pedersen et al. . |
| 5,260,611 | 11/1993 | Cliff et al. . |
| 5,296,759 | 3/1994 | Sutherland et al. . |
| 5,350,954 | 9/1994 | Patel . |
| 5,371,422 | 12/1994 | Patel et al. ............................... 326/41 |
| 5,448,186 | 9/1995 | Kawata .................................... 326/41 |
| 5,455,525 | 10/1995 | Ho et al. .................................. 326/41 |
| 5,457,410 | 10/1995 | Ting ......................................... 326/41 |
| 5,537,057 | 7/1996 | Leong et al. ............................. 326/41 |

FOREIGN PATENT DOCUMENTS

| | | | |
|---|---|---|---|
| 9410754 | 5/1994 | WIPO .................................... | 326/41 |

OTHER PUBLICATIONS

H. Fleisher et al., "The Writeable Personalized Chip," *Computer Design*, Jun. 1970, pp. 59–66.

R. G. Shoup, "Programmable Cellular Logic Arrays," Ph.D. Dissertation, Carnegie–Mellon University (Pittsburgh), Mar. 26, 1970.

*The Programmable Logic Data Book*, Xilinx, Inc., 1994, pp. 2-7-2-46, 2-105-2-152.

Xilinx, Inc., "XC5000 FPGA Family: Product Review Sheet," Sep. 1994.

*Primary Examiner*—Edward P. Westin
*Assistant Examiner*—Jon Santamauro
*Attorney, Agent, or Firm*—Fish & Neave; Jeffrey H. Ingerman

[57] ABSTRACT

A programmable logic array device in which programmable logic regions are arranged in groups of four is provided. The device includes direct connect conductors for carrying signals totally within one group of four regions as well as to certain adjacent programmable logic regions, local conductors for carrying signals within groups and among adjacent groups, and global conductors for carrying device-wide signals. Connections among the various conductors, and between conductors and programmable logic regions, are provided to optimize the connection resources by avoiding switched conductor paths wherever possible.

25 Claims, 5 Drawing Sheets

PROGRAMMABLE LOGIC ARRAY DEVICE WITH GROUPED LOGIC REGIONS AND THREE TYPES OF CONDUCTORS

CROSS REFERENCE TO RELATED APPLICATION

This a continuation of, commonly-assigned U.S. patent application Ser. No. 08/388,300, filed Feb. 14, 1995, now U.S. Pat. No. 5,537,057.

BACKGROUND OF THE INVENTION

This invention relates to programmable logic array integrated circuit devices, and more particularly to programmable logic array devices having discrete programmable logic regions that are grouped together and are interconnected by three types of conductors.

Programmable logic array integrated circuits are well known as shown, for example, by commonly-assigned U.S. Pat. Nos. 5,260,610 and 5,260,611, which are hereby incorporated by reference in their entirety. As shown in those patents, many modern programmable logic array devices have a large number of programmable logic regions disposed in a two-dimensional array on the integrated circuit. Each programmable logic region is capable of performing a relatively simple logic function, the particular logic function performed by each programmable logic region being selected when the device is "programmed" prior to its use as a logic device. Interconnection conductors are provided on the device for (1) delivering to each programmable logic region the signals on which that programmable logic region will operate, and (2) conveying from each programmable logic region the signals indicative of the logic performed by that programmable logic region. These interconnection conductors can be used to convey output signals from one programmable logic region to the inputs of other programmable logic regions, thereby making it possible for the programmable logic array device to perform much more complex logic functions than any individual programmable logic region can perform. Just as the logic functions performed by the individual programmable logic regions are programmable, many of the connections between interconnection conductors and between the programmable logic regions and the interconnection conductors are also typically programmable so that the manner in which signals are routed through the interconnection conductors and the manner in which the programmable logic regions are thereby interconnected is also programmable.

It is difficult to design a programmable logic array device of the type described above which has just the right ratio of programmable logic region resources to interconnection conductor resources. These devices are intended as general-purpose devices, and the designer of a device cannot know all of the many uses to which end users may wish to put the device. For example, some uses may require a high degree of interconnection between programmable logic regions, while other uses may need much less interconnection. Even the type of interconnection needed by the user may vary. Some uses may involve functions with large fan out, requiring wide distribution of a programmable logic region output to many other programmable logic regions. Other uses may involve more incremental logic, never requiring that any programmable logic region output go to more than a small number of other programmable logic regions.

One device architecture for providing interconnection circuitry that will meet a variety of needs is shown in U.S. Pat. No. Re. 34,363, and embodied in a commercial product available from the assignee of that patent. That architecture includes many short segments of conductor, having lengths on the order of the length of one programmable logic region. Those short conductors are programmably interconnectable to route signals from one programmable logic region to one or more other programmable logic regions. Although a small number of "global" conductors—i.e., conductors that span an entire dimension of the array—are provided, most "long-distance" connections between programmable logic regions must be constructed by programmably connecting a number of short conductors. A disadvantage of this approach is that each conductor connection tends to delay and attenuate the signal being transmitted. Because the numbers of conductor connections through which various signals may have to travel can vary significantly, maintaining synchronization and uniform level among several signals can be difficult or may limit the speed at which the device can be operated. Moreover, to the extent that programming a programmable interconnection consumes a portion of the memory and programming resources of the device, constructing long-distance interconnections by programmably connecting large numbers of short conductors consumes a large amount of device resources that otherwise could be devoted to logic functions.

One of the motivations behind the architecture just described is that heretofore integrated circuit devices were primarily provided on substrates having one semiconductor layer, in which the programmable elements are formed, and two metallization layers, in which conduction paths are formed, all separated by appropriate insulating layers.

Recently, semiconductor devices having three metallization layers have become more readily available. It would be desirable to be able to provide a programmable logic array device architecture that takes advantage of the greater availability of such devices. In particular, it would be desirable to be able to provide a programmable logic array device architecture that relies on fewer programmable resources to achieve connections between programmable logic regions thereof. It would also be desirable to be able to provide such a device having a greater number of global conductors.

Summary of the Invention

It is an object of this invention to provide a programmable logic array device architecture that takes advantage of the greater availability of semiconductor devices having three metallization layers.

In particular, it is an object of this invention to provide a programmable logic array device architecture that relies on fewer programmable resources to achieve connections between programmable logic regions thereof.

It is also an object of this invention to provide such a device having a greater number of global conductors.

In accordance with the present invention, there is provided a programmable logic array device having first and second substantially orthogonal array dimensions. The device includes a plurality of regions of programmable logic arranged in rows and columns substantially along the two orthogonal array dimensions. Each of the regions has a plurality of inputs and a plurality of outputs and produces an output signal on the output which is a programmable function of an input signal applied to the inputs of the region. A first group of conductors conveys signals among the regions.

Each conductor of the first group of conductors extends substantially parallel to one of the rows and the columns over at least a substantial portion of one of the array dimensions. Each of the regions is adjacent at least one conductor of the first group of conductors. A second group of conductors conveys at least one of (a) signals within a logic subset of the plurality of regions, (b) signals between adjacent ones of the logic subsets, and (c) signals between nearby ones of the logic subsets. Each conductor of the second group of conductors extends substantially parallel to one of the rows and columns and has a length at least equal to about a dimension of one of the regions and at most equal to about a dimension of the logic subset. Each of the regions is adjacent at least one conductor of the second group of conductors. A third group of conductors conveys both (a) signals between any one of the regions and each other region that is (i) adjacent that one of the regions, and (ii) in one of a same row and a same column as that one of the regions, and (b) signals between any one of the regions and each other region that is (i) diagonally adjacent that one of the regions, and (ii) in one of the logic subsets with that one of the regions. A first group of connectors programmably selectively connects conductors adjacent to any one of the regions to the inputs and outputs of that one of the regions. A second group of connectors programmably selectively connects any conductor in one of the first and second groups of conductors to one of (a) another conductor in that one of the first and second groups of conductors, and (b) a conductor in another of the first and second groups of conductors.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
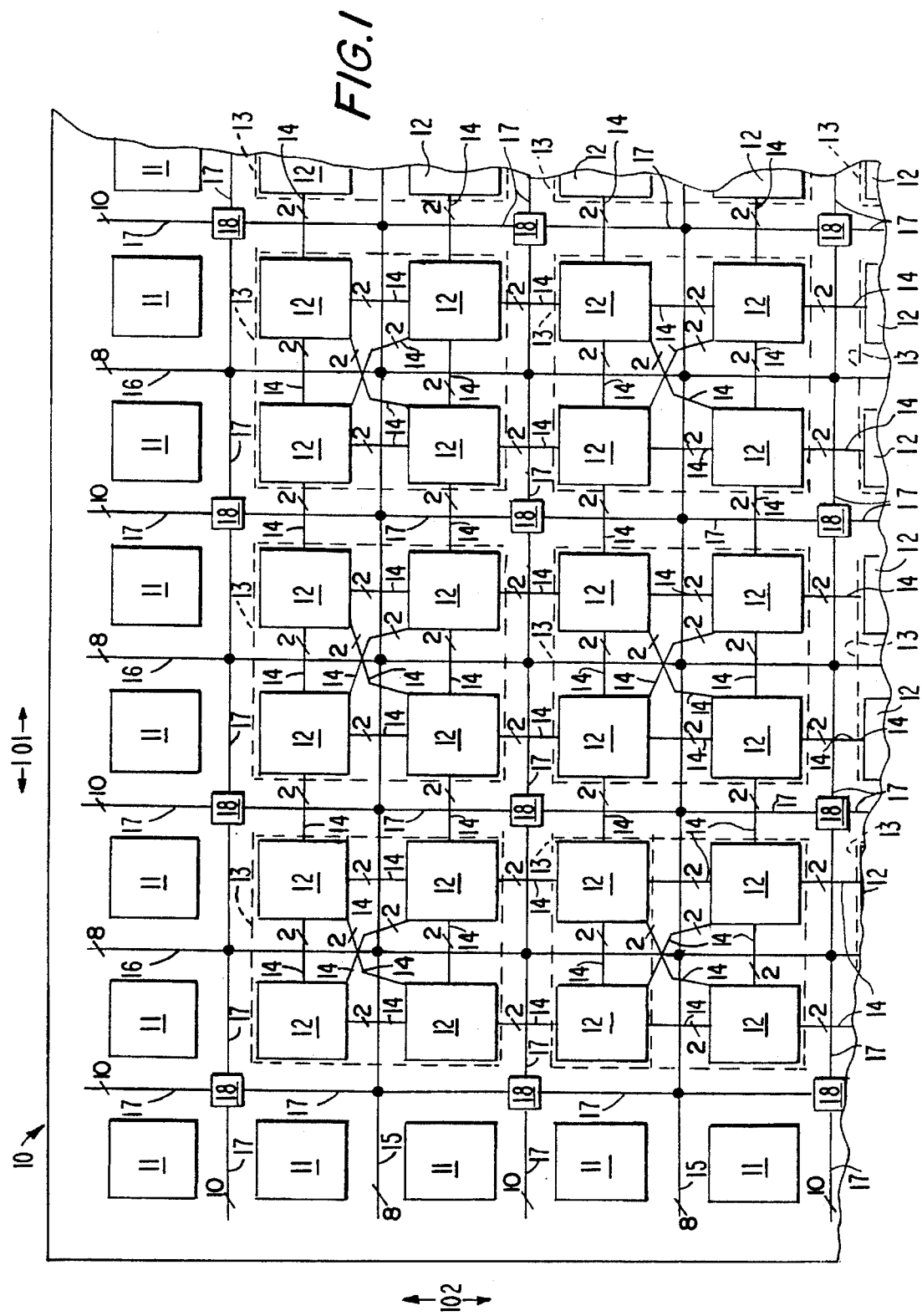
FIG. 1 is a simplified partial block diagram of an illustrative programmable logic array device according to the invention.

Programmable logic array devices according to the present invention have some characteristics of the previously known, commercially available devices of the type described above. Specifically, a device according to the present invention has a number of discrete programmable logic regions arranged in an array of substantially horizontal rows and substantially vertical columns. The device also has a number of input/output regions, for receiving inputs from, and communicating logic outputs to, external devices. The input/output regions programmably connect conductors that carry signals within the device to input/output pins of the device.

Each programmable logic region has a programmable logic function portion which can perform any one of a predetermined set of logic functions, depending on how certain programming bits are set. In a preferred embodiment, each potential logic function result is stored as an entry in a look-up table in each region. A particular function for particular inputs can be selected or "programmed" by setting a bit in an appropriate register or memory corresponding to the look-up table entry that would be selected by those particular inputs. Of course, the logic functions can be provided other than through a look-up table.

Each programmable logic region has a plurality of inputs and outputs. Some of the inputs are for device-wide signals, such as control signals including clock, preset and clear signals. Other inputs, as well as the outputs, are for logic inputs and outputs. Each input or output is preferably dedicated to a specific logic input or output, and can be programmably connected to the appropriate conductor for communicating outside the programmable logic region, as discussed below.

Three types of conductors carry signals within a device according to the present invention. Conductors of the first type are "direct connect conductors" for connecting adjacent programmable logic regions. In the preferred embodiment, each programmable logic region, except for those on the edges of the programmable logic array, has a set of direct connections available to five adjacent programmable regions—i.e., two adjacent programmable logic regions in the same row, two adjacent programmable logic regions in the same column, and one diagonally adjacent programmable logic region. Of the four potential diagonally adjacent programmable regions to which a direct connection could be made, the one region selected is chosen by dividing the entire array into logic subsets, with each logic subset preferably having four programmable regions arranged in a two-by-two configuration. The diagonal direct connections in the preferred embodiment are selected so that each programmable logic region can communicate directly with each other programmable region in the logic subset, as well as with each adjacent programmable logic region in the same row or column even in different logic subsets.

If larger logic subsets are used, more diagonal direct connections might be provided. For example, if each logic subset contained nine programmable regions in a three-by-three configuration, each of the corner programmable logic regions would probably still have only one set of diagonal direct connections, but the central region might have four sets of diagonal direct connections and each programmable logic region in the middle of a side of the logic subset might have two sets of diagonal direct connections. Still other numbers of programmable logic regions could be grouped into logic subsets, but preferably no programmable logic region has a direct connection to more than eight adjacent programmable logic regions. Preferably, each set of direct connections includes two connections.

The direct connections from the logic inputs and outputs of each programmable logic region could be purely programmable—i.e., the available direct connect conductors could be programmably connected to any input or output as desired. Alternatively, and more preferably, each output has a dedicated direct connect connection that is programmably connectable to a specific predetermined input of a neighboring region. If that output is not to be directly connected to an adjacent programmable logic region, it can still be programmably connected to an external conductor. Similarly, the input to the other programmable logic region could be programmably connected to an external conductor.

The direct connect conductors are the most efficient in terms of device resources. As their name implies, they lead directly from one programmable logic region to another, using substantially the minimum amount of metallization resources necessary to traverse the distance between two points. They also use few, if any, programming resources. As stated above, the direct connect conductors preferably are truly directly connected to fixed outputs. Even if the particular inputs and outputs to which they are connected are selectable, there is still a maximum of two programmable connections per direct connect conductor.

Next in terms of length are the local conductors, which have lengths on the order of the size of a programmable logic region and are useful for routing signals within a logic subset of programmable logic regions, or between different logic subsets that are adjacent (i.e., directly contiguous) or nearby (i.e., separated by a relatively small number of intervening logic subsets). In the preferred embodiment in which there are four programmable logic regions in a two-by-two configuration in each logic subset, each local conductor preferably has a length about equal to the length of two programmable logic regions. Each logic subset preferably has at least one set of local conductors which preferably runs horizontally adjacent the logic subset and at least one set of local conductors which preferably runs vertically adjacent the logic subset, so that the inputs and outputs of each programmable logic region in the logic subset have easy access to both horizontal and vertical local conductors. Most preferably, each set of local conductors includes about ten conductors.

In this preferred embodiment, each set of local conductors is connected by a programmable switchbox adjacent a corner of the logic subset to three (except, e.g., at the device edges) other sets of local conductors, including sets of local conductors from adjacent logic subsets. Indeed, each set of local conductors serves programmable logic regions in two (except, e.g., at the device edges) different logic subsets, while each programmable switchbox serves local conductors from four (except, e.g., at the device edges) different logic subsets. Thus, while each logic subset of four programmable logic regions is served by four switchboxes, there is in fact preferably only about one switchbox for every four programmable logic regions. Similarly, while each logic subset of four programmable logic regions is served by four sets of local conductors, there are in fact preferably only about two sets of local conductors for every four programmable logic regions.

A matrix of programmable connections between each set of local conductors and the inputs and outputs of the programmable logic regions adjacent those local conductors is provided, as will be described in more detail below. The programmable switchboxes for connecting sets of local conductors also will be described below.

Greatest in length after the direct connect conductors and the local conductors are the global conductors. Preferably, each global conductor extends substantially the full length of one dimension of the programmable logic array device, although there may be global conductors that extend only along a substantial portion of that length. Preferably, one set of vertical global conductors and one set of horizontal global conductors run through each logic subset—i.e., there are preferably one set of horizontal global conductors for each row of logic subsets and one set of vertical global conductors for each column of logic subsets. Most preferably, the horizontal and vertical global conductors intersect substantially adjacent the center of each logic subset of four programmable logic regions, so that the inputs and outputs of each programmable logic region in the logic subset have easy access to both horizontal and vertical global conductors. Also most preferably, each set of global conductors includes about eight conductors.

Programmable connections are provided between each programmable logic region and its adjacent global conductors as described below. Programmable connections are also provided between horizontal and vertical global conductors where they intersect. It will also be understood from the foregoing description, as well as from the drawings discussed below, that each set of global conductors intersects the local conductors—e.g., adjacent the centers of the sides of each logic subset in the preferred embodiment. Connections between the local and global conductors are provided at those intersections as discussed below.

Programmable connections in devices according to the present invention can be divided into two groups—connections between conductors and inputs or outputs of programmable logic regions, and connections between different conductors.

As described above, the direct connect conductors can have fixed connections to particular inputs and outputs, but some or all of those connections preferably are programmable. Because the direct connect conductors are preferably provided in sets of two, even if connections to the direct connect conductors are fully populated (i.e., all combinations are available), they consume few programming and memory resources.

Connections between local conductors and the inputs and outputs of the programmable logic regions preferably are both fully programmable and fully populated, so that any input or output can be connected to any local conductor in the set of local conductors adjacent that input or output.

Connections between global conductors and the inputs and outputs of the programmable logic regions preferably are also fully programmable, but sparsely populated, so that any input or output can be connected to at least one, but not necessarily all, global conductors in the set of global conductors adjacent that input or output. In that sense, the connections of the global conductors to the programmable logic region inputs and outputs are more efficient than those of the local conductors. However, because signals on global conductors may have to propagate the entire length or width of the programmable logic array device, at least the connections between the logic outputs and the global conductors preferably are buffered, so that the global conductors are properly driven. More preferably, the buffers are three-state devices, so that the global conductors can be used to set up a three-state bus throughout the device if desired. The need to use buffers detracts somewhat from the efficiency advantage of the global conductors over the local conductors in terms of connection resources.

With respect to connections between conductors, where horizontal and vertical global conductors intersect, there is preferably a sparsely populated set of connections, so that every horizontal or vertical global conductor can connect, in either direction, to at least one vertical or horizontal global conductor, respectively. For the reasons discussed in the preceding paragraph, these connections preferably are buffered, and more preferably are three-state connections to facilitate the device-wide three-state bus described above.

Where global conductors intersect local conductors, there again is a sparsely populated set of connections. For reasons discussed below, there preferably are enough connections for any signal on a global conductor to be propagated onto a local conductor, but not necessarily for any signal on a local conductor to be propagated onto a global conductor. To the extent that connections are provided for propagating signals from local conductors to global conductors, they would preferably be buffered as described above.

As set forth above, where sets of local conductors intersect, a programmable switchbox is provided. In the preferred embodiment described above, each switchbox connects the ends of four separate sets of local conductors. The switchbox is sparsely populated, but sufficiently populated that every conductor in one set of conductors served by that switchbox can reach at least one conductor in each of the other sets of conductors served by the switchbox. One preferred potential construction for the switchbox is that shown in *The Programmable Logic Data Book*, Xilinx, Inc., 1994, pp. 2-14–2-15. The nature of the switchbox is such that each connection between two conductors may require more than one programmable connection within the switchbox. For this reason, as discussed below, it is desirable to avoid routing signals through the switchboxes whenever possible to conserve resources and to minimize delays and distortions of the signals.

In an optimally programmed device according to the present invention, one should preferably route as many signals as possible onto direct connect conductors or global conductors. And to the extent that combinations of global and local conductors are required, one should preferably minimize the amount of local conductors used and preferably use the local conductors only at the end of the routing if at all possible.

Thus, signals travelling within a logic subset should be routed, if at all possible, on direct connect conductors, given that in the preferred embodiment every programmable logic region in a logic subset is connected by direct connect conductors to every other programmable logic region in that logic subset. However, not every input or output within a logic subset can necessarily reach a direct connect conductor. To the extent that a connection within a logic subset cannot be made using direct connect conductors, so that local conductors must be used, it is then preferable to minimize the number of local lines used, and thus the number of switchboxes through which the signal has to pass. Indeed, it might be preferable to use a global conductor rather than local conductors, except that use of a global conductor for local signal routing within one logic subset would preclude use of that conductor throughout the entire device.

Direct connect conductors can also be used for signals that travel between adjacent programmable logic regions in different logic subsets, depending on which inputs and outputs are used. If the user is not using the available logic resources intensely, it may also be possible to route signals from a programmable logic region in one logic subset to a non-adjacent programmable logic region in an adjacent logic subset, by using an otherwise unused or underused programmable logic region as a relay. However, the latter option is not used frequently because the programmable logic regions are normally needed for logic functions.

If direct connect conductors cannot be used for routing signals between adjacent logic subsets, then local conductors should be used, as it would be a waste of a global conductor for the reasons discussed above. Still, one should try to minimize the number of switchboxes through which the signals must pass. For example, in the case of a diagonally adjacent programmable logic region in an adjacent logic subset, the signal can be routed on a local conductor common to both programmable logic regions, without passing through any switchboxes.

For signal routing to nearby, but non-adjacent, logic subsets, local conductors are probably best, as long as the number of switchboxes is minimized as much as possible. At some point, it becomes more advantageous to switch to global conductors when the distance involved becomes too great, but that is in part a function of how many other signals have to travel long distances and how many of them have a greater need for the superior signal propagation characteristics of the global conductors.

For example, device-wide signals, such as register inputs (e.g., clocks, presets and clears), must be routed to every programmable logic region of the device, and must remain unattenuated, undistorted, and in synchrony. Therefore, such signals have priority for the use of global conductors. The preferred embodiment described above, in which every programmable logic region is adjacent to both horizontal and vertical global conductors, is particularly advantageous for that reason, and care should be taken to fabricate the device with the register inputs in the portions of the programmable logic regions adjacent the global conductors.

No matter what type of signal is involved, it is easier to route signals over global conductors when they are available. Global conductors reach all parts of the device, and it is not necessary when using them to search for free switchboxes, as it is when using local conductors.

In general, the philosophy for routing a signal according to the present invention is that if direct connect conductors are not appropriate, and global conductors can be used, the signal should be routed onto the global conductor as soon as possible, preferably immediately. If the destination of the signal cannot be reached without using local conductors, the signal should be routed onto local conductors as close as possible to the destination. Thus, one would not expect as many signals to be routed from local conductors onto global conductors, as there would be signals routed from global conductors onto local conductors.

The present invention is preferably implemented on an integrated circuit substrate having three metallization layers. In one such embodiment, the semiconductor layer would contain the programmable logic elements, one metallization layer might contain substantially all horizontal conductors, a second metallization layer might contain substantially all vertical conductors, and a third metallization layer might contain diagonal conductors such as the direct connect conductors, and would also be used for greater flexibility in conductor routing, including facilitating crossing over of conductors. The third metallization layer is also used to interconnect the transistors and other elements in the semiconductor layer that form the programmable logic regions and switchboxes. Thus the third metallization layer would normally be the one closest to the semiconductor layer, while the order of the other two layers is less important.

A preferred embodiment of a programmable logic array device 10 according to the present invention is shown in FIGS. 1–5. It will be understood, however, in connection with FIGS. 1–5, that the drawings depict device 10 architecturally, and the actual topology of device 10 may not be exactly as shown. For example, a particular set of conductors may not run so neatly between programmable logic regions as shown, but rather would likely run adjacent the programmable logic regions in a different layer of device 10, probably at least partially overlapping one or more programmable logic regions.

As can be seen in FIG. 1, programmable logic array device 10 is preferably a substantially rectangular array extending in two substantially orthogonal dimensions 101, 102, and having a plurality of programmable input/output regions 11 arranged around its periphery, and a plurality of programmable logic regions 12 arranged in its interior. In accordance with the present invention, programmable logic regions 12 are preferably grouped into logic subsets 13 each containing four programmable logic regions 12.

Within each logic subset 13, programmable logic regions 12 are preferably interconnected by sets of direct connect conductors 14, such that each programmable logic region in one logic subset 13 is connected to each other programmable logic region 12 in that logic subset 13 to which it is horizontally, vertically or diagonally adjacent. In the case of four programmable logic regions 12 per logic subset 13, that means that each programmable logic region 12 in a logic subset 13 is directly connected to each other programmable logic region 12 in that logic subset 13, but that would not be the case in a logic subset having more than four programmable logic regions 12. In addition, each programmable logic region 12 preferably is also connected by a set of direct connect conductors 14 to each programmable logic region 12 that is in a different logic subset 13 but to which it is horizontally or vertically adjacent. Thus the total number of sets of direct connect conductors 14 is a function of the number of programmable logic regions 12 and the number of programmable logic regions 12 in a logic subset 13, rather than a function of either the number of logic subsets 13. Each set of direct connect conductors 14 preferably includes two conductors.

Traversing programmable logic array device 10 adjacent (and architecturally between) various input/output regions 11 and programmable logic regions 12 are a plurality of horizontal global conductors 15 and a plurality of vertical global conductors 16, which are connected to the various programmable logic regions 12 in the manner shown below, as well as to the input/output regions 11 (in a manner not shown). A group of conductors running parallel to one another without being separated (as depicted architecturally) by programmable logic regions can be considered a set of conductors. (In fact, the various conductors in a set may be separated but preferably will at least be generally parallel and near one another.) Preferably, each set of global conductors 15, 16, whether horizontal or vertical, includes eight individual conductors 150, 160. Also, each set of global conductors 15, 16 preferably runs through logic subsets 13 in such a way that each of the inputs and outputs of each programmable logic region 12 has access to both vertical and horizontal global conductors. Architecturally, that can be depicted by showing the global conductors running in the area between the programmable logic regions 12 in the logic subsets 13, so that each programmable logic region 12 is bounded on two sides by global conductors 15, 16.

The third type of conductor is the local conductors 17, which preferably run both horizontally and vertically between logic subsets 13. Architecturally, any two programmable logic regions 12 are separated by a set of global conductors 15, 16, or by a set of local conductors 17, but not by both nor by empty space. Each set of local conductors 17, which preferably includes ten individual conductors 170, is preferably about as long as one side of a logic subset 13 or two programmable logic regions 12. Each logic subset 13 therefore has access to, and architecturally is bounded on four sides by, local conductors 17, but, except possibly at the edges of the array, each logic subset 13 shares each set of local conductors 17 with an adjacent logic subset 13. For each programmable logic region 12 within a particular logic subset 13, on the other hand, the inputs and outputs of each programmable logic region 12 have access to only two sets 17 of local conductors, one horizonal and one vertical. This is depicted architecturally by showing each programmable logic region 12 bounded on only two sides by local conductors 17, the other two sides of each programmable logic region 12 being bounded by global conductors 15, 16 as set forth above.

The connections among the various conductors and between the conductors and the programmable logic regions 12 will be described in more detail below in connection with other drawings, but FIG. 1 shows switchboxes 18 connecting each group of four sets of local conductors 17 where they meet (at the corners of logic subsets 13, architecturally).

Figure 2:
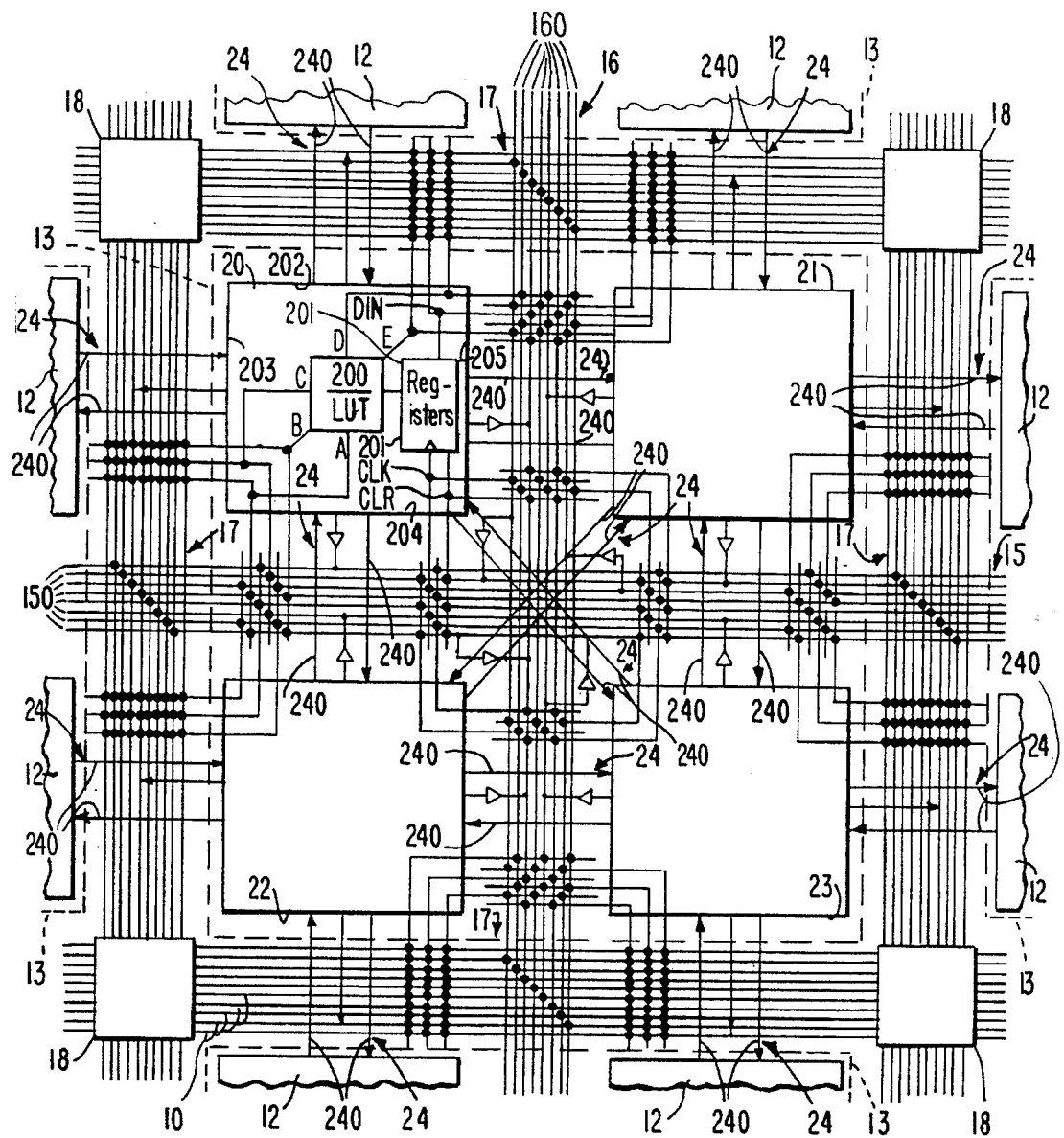
FIG. 2 is a schematic block diagram of a representative portion of the device of FIG. 1.
Figure 3:
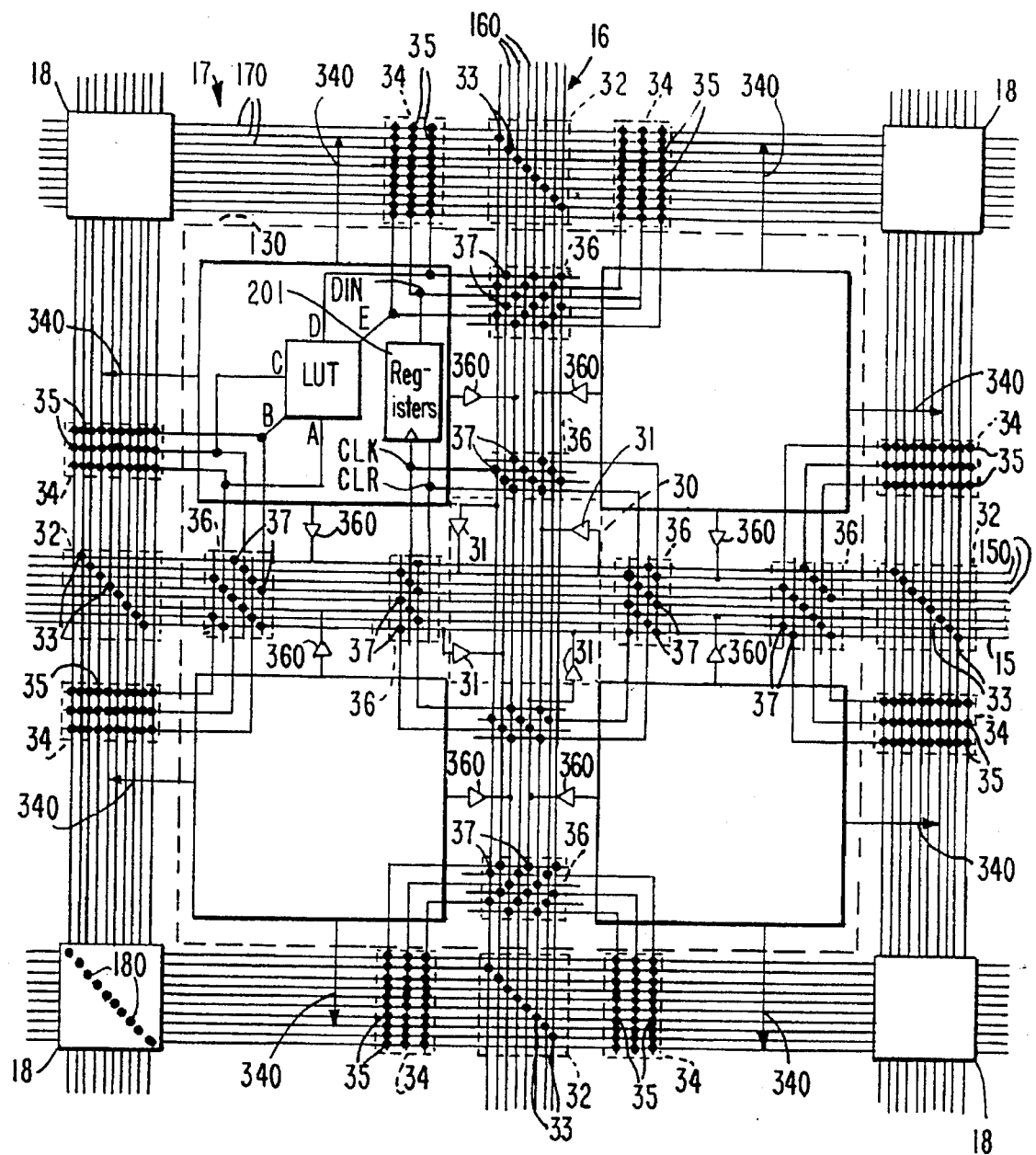
FIG. 3 is a schematic block diagram of the representative portion of FIG. 2 showing only certain connections.
Figure 4:
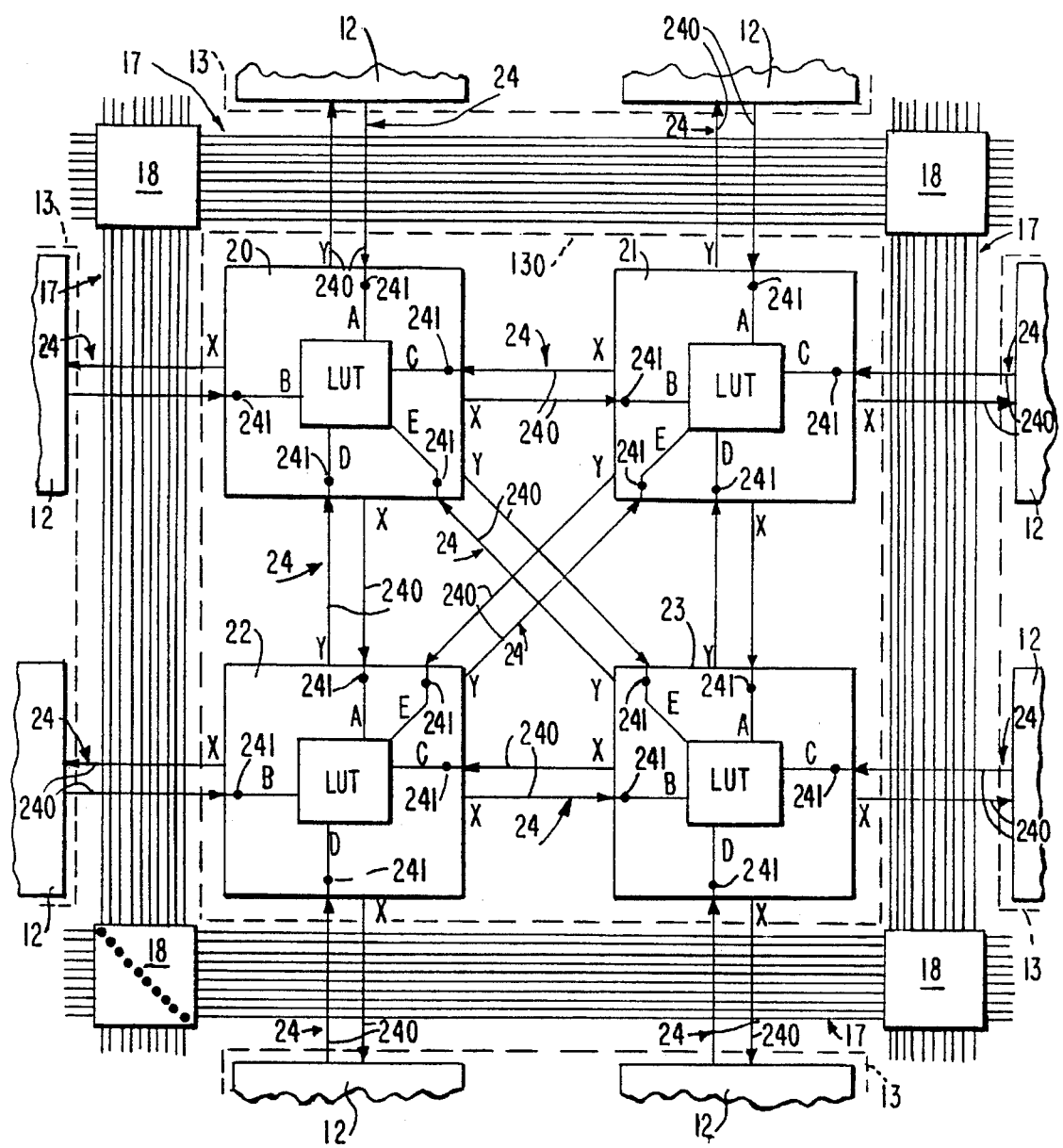
FIG. 4 is a schematic block diagram of the representative portion of FIGS. 2 and 3 showing certain other connections.

FIGS. 2–4 show details, for the preferred embodiment, of the interior of a single logic subset 130, along with its direct, local and global conductors. In particular, a representative logic subset 130 preferably contains four programmable logic regions 12, separately numbered for purposes of discussion as programmable logic regions 20, 21, 22, 23. Interior details of programmable logic region 20 (programmable logic regions 21, 22, 23 are substantially identical) are shown schematically in FIGS. 2 and 3. Programmable logic region 20 contains a look-up table (LUT) 200 as described above, having five inputs labelled A–E. Connected to LUT 200 are registers 201, having clock (CLK), clear (CLR) and data_in (DIN) inputs. Programmable logic region 20 also has two outputs labelled X and Y (FIG. 4). This configuration for programmable logic region 12 is described in more detail in *The Programmable Logic Data Book*, Xilinx, Inc., 1994, pp. 2-109–2-111.

One set 15 of horizontal global conductors, preferably containing eight horizontal global conductors 150, preferably passes substantially horizontally substantially adjacent the center of logic subset 130. Similarly, one set 16 of vertical global conductors, preferably containing eight vertical global conductors 160, preferably passes substantially vertically substantially adjacent the center of logic subset 130. Similarly, four sets 17 of local conductors, each preferably containing ten local conductors 170, preferably run adjacent logic subset 130, and meet adjacent the corners of logic subset 130, with switchboxes 18.

Thus, the inputs and outputs of each programmable logic region 20, 21, 22, 23 in logic subset 130 have access to one horizontal and one vertical set of local conductors 17, and to one horizontal and one vertical set of global conductors 15, 16. Architecturally, this is depicted by showing each programmable logic region 20, 21, 22, 23 bounded on each of two sides by a set 17 of local conductors, and on each of two other sides by a set 15, 16 of horizontal or vertical global conductors. In the case of programmable logic region 20 as shown architecturally, for example, each of sides 202, 203 is bounded by a set 17 of local conductors, side 204 is bounded set 15 of horizontal global conductors, and side 205 is bounded by set 16 of vertical global conductors. Note that the clock (CLK) and clear (CLR) inputs of register 201 are located where they can be easily connected to one of horizontal global conductors 150 or one of vertical global conductors 160, as discussed above. Although not shown, the interiors of programmable logic regions 21–23 are mirror images of that of programmable logic region 20, reflected around global conductors 15 or 16 as appropriate, so that their clock and clear inputs are also accessible to either set of global conductors passing through logic subset 130.

As shown in FIG. 2, associated with logic subset 130 are fourteen sets 24 of direct connect conductors 240. Twelve sets 24 connect each programmable logic region 20–23 in logic subset 130 to horizontally or vertically adjacent other ones of programmable logic regions 20–23, as well as to horizontally or vertically adjacent programmable logic regions 12 in adjacent logic subsets 13. In addition, one set 24 of direct connect conductors 240 diagonally connects programmable logic regions 21 and 22, while another set 24 of direct connect conductors 240 diagonally connects programmable logic regions 20 and 23. The details of the direct connections will be discussed below in connection with FIG. 4.

FIG. 3 is similar to FIG. 2, but omits, for clarity's sake, direct connect conductors 240 and the adjacent programmable logic regions 12, to facilitate discussion of the connections among and between individual global conductors 150, 160, individual local conductors 170 and the inputs and outputs of programmable logic regions 20–23.

Depicted architecturally substantially at the center of logic subset 130 is intersection 30 of set 15 of horizontal global conductors and set 16 of vertical global conductors. Intersection 30, which is actually adjacent the center of logic subset 130 in the metallization layers above it, includes a sparsely populated interconnection matrix between horizontal global conductors 150 in set 15 and vertical global conductors 160 in set 16, so that while it is preferably not possible to connect all horizontal global conductors 150 to all vertical global conductors 160, it is possible to connect each horizontal global conductor 150 to at least one vertical global conductor 160 and vice-versa. The exact number of possible connections that should be provided depends on the statistical probability that a connection will be needed and on the degree of flexibility that is desired. The connections between global conductors are preferably buffered by preferably three-state devices for the reasons set forth above, and the buffered sparsely populated matrix is represented schematically by the four buffers 31, each of which represents a plurality of possible three-state buffered connections.

Depicted architecturally substantially in the middle of each side of logic subset 130 is an intersection 32 between a set 15, 16 of global conductors 150, 160 and a set 17 of local conductors 170. Intersection 32, which is actually adjacent the center of a side of logic subset 130 in the metallization layers above it, preferably contains a sparsely populated matrix of connections between local conductors 170 and global conductors 150, 160. Preferably, as shown, each global conductor 150, 160 in intersection 32 is programmably connected by a programmable switch 33, which can be any function-controlled element (such as an SRAM cell, EPROM cell, fuse, antifuse, etc.), to one of the local conductors 170 in that intersection 32. In the preferred embodiment in which there are ten local conductors 170 and only eight global conductors 150, 160, that means that every global conductor 150, 160 can be connected to a local conductor 170, but not every local conductor 170 can be connected to a global conductor 150, 160. In view of the preferred operation of device 10 as described above, where signals are preferably run on global conductors until they get near their destination, it is more important to get signals off global conductors 150, 160 and onto local conductors 170 than the other way around. As long as this sparse connection is available, it will be possible to find a routing to get all signals where they are needed, without having to provide the resources of a fully populated connection. Although not shown, buffers may be provided if it is intended to direct signals from a local conductor 170 to a global conductor 150, 160 at intersection 32.

Each switchbox 18 is preferably fed by four sets 17 of local conductors 170. As set forth above, each switchbox 18 is preferably capable of attaching each local conductor 170 in each set 17 to at least one other local conductor 170 in one of the other sets 17 using programmable connections 180. Again, as long as this sparse connection is available, it will be possible to find a routing to get all signals where they are needed, without having to provide the resources of a fully populated connection. As stated above, the preferred construction of each switchbox 18 is that described in *The Programmable Logic Data Book*, Xilinx, Inc., 1994, pp. 2-14–2-15.

Each input to one of programmable logic regions 20–23 is available to both local conductors 170 and global conductors 150, 160, and a signal on any conductor 150, 160, 170 can be routed on that conductor directly into the respective programmable logic region 20–23. However, because there are not enough global conductors 150, 160 for every signal, it is more likely that a particular signal will have to be routed to its respective programmable logic region 20–23 via a local conductor 170. Therefore, each input is connected to local conductors 170 in a fully populated matrix 34 of programmable switches (function-controlled elements) 35. While the inputs are also connected to global conductors 150, 160, those global connections are made by a sparsely populated matrix 36 of programmable switches (function-controlled elements) 37. The only exceptions are the register inputs (CLK and CLR) which preferably are connected only to global conductors for the reasons discussed above. However, while other inputs are connected (sparsely) either to horizontal global conductors 150 or to vertical global conductors 160, the register inputs (CLK and CLR) are connected (sparsely) to both horizontal global conductors 150 and vertical global conductors 160, to maximize the chance of finding routings on global conductors for those signals.

The outputs are handled similarly to the inputs. Outputs are connected both to local conductors 170 and to global conductors 150, 160. Arrows 340 represent fully populated output matrices similar to input matrices 34. Outputs to global conductors 150, 160 are handled slightly differently from inputs from global conductors 150, 160. For the reasons discussed above, the outputs, which inject signals onto global conductors 150, 160, preferably are buffered to drive the global conductors 150, 160 properly. Buffers 360 represent sparsely populated output matrices similar to input matrices 36, except that each programmable connection is preferably buffered, preferably by a three-state buffer as discussed above.

It should be noted that while FIGS. 2–4 do not show connections between local conductors 170 and programmable logic regions 12 of adjacent logic subsets 13, each set 17 of local conductors 170 is connected by additional matrices, similar to matrices 34, 340, to such adjacent programmable logic regions 12.

With global conductors 150, 160 and all of their connections removed for clarity, FIG. 4 best shows direct connect conductors 240. In each set 24 of preferably two direct connect conductors 240, one of the direct connect conductors 240 preferably is permanently connected to an output at one end thereof and is programmably connected, by programmable switch 241, to an input at the other end thereof. In the preferred embodiment shown, at the top of each programmable logic region 20–23, one conductor 240 preferably is permanently connected to the Y-output of programmable logic region 20–23, while the other conductor 240 preferably is programmably connected to the A-input of programmable logic region 20–23. At the bottom of each programmable logic region 20–23, one conductor 240 preferably is permanently connected to the X-output of programmable logic region 20–23, while the other conductor 240 preferably is programmably connected to the D-input of programmable logic region 20–23. At the right side of each programmable logic region 20–23, one conductor 240 preferably is permanently connected to the X-output of programmable logic region 20–23, while the other conductor 240 preferably is programmably connected to the C-input of programmable logic region 20–23. At the left side of each programmable logic region 20–23, one conductor 240 preferably is permanently connected to the X-output of programmable logic region 20–23, while the other conductor 240 preferably is programmably connected to the B-input of programmable logic region 20–23. In this way, each programmable logic region 20–23 preferably is connected to each other programmable logic region that is above or below it, or to the right or left of it, including other ones of programmable logic regions 20–23, as well as programmable logic regions 12 in other logic subsets 13.

In addition, programmable logic regions 20 and 23 are preferably diagonally interconnected, as preferably are programmable logic regions 21 and 22. Each diagonal interconnection includes one conductor 240 preferably permanently connected to a respective Y-output and another conductor 240 preferably programmably connected to a respective E-input.

A programmable connection between a conductor 240 and an input can in fact be programmed, or can remain unprogrammed, allowing the input to be connected through the local or global conductors using the connection resources previously described. Similarly, although an output may be permanently connected to a conductor 240, that conductor need not be connected at its other end, and its output can still be routed on the local or global conductors. However, in cases where a particular input or output needs to be routed from or to an adjacent programmable logic region 12, 20–23, direct connect conductors 240 are the preferred choice for that connection in terms of both device resources and speed.

Figure 5:
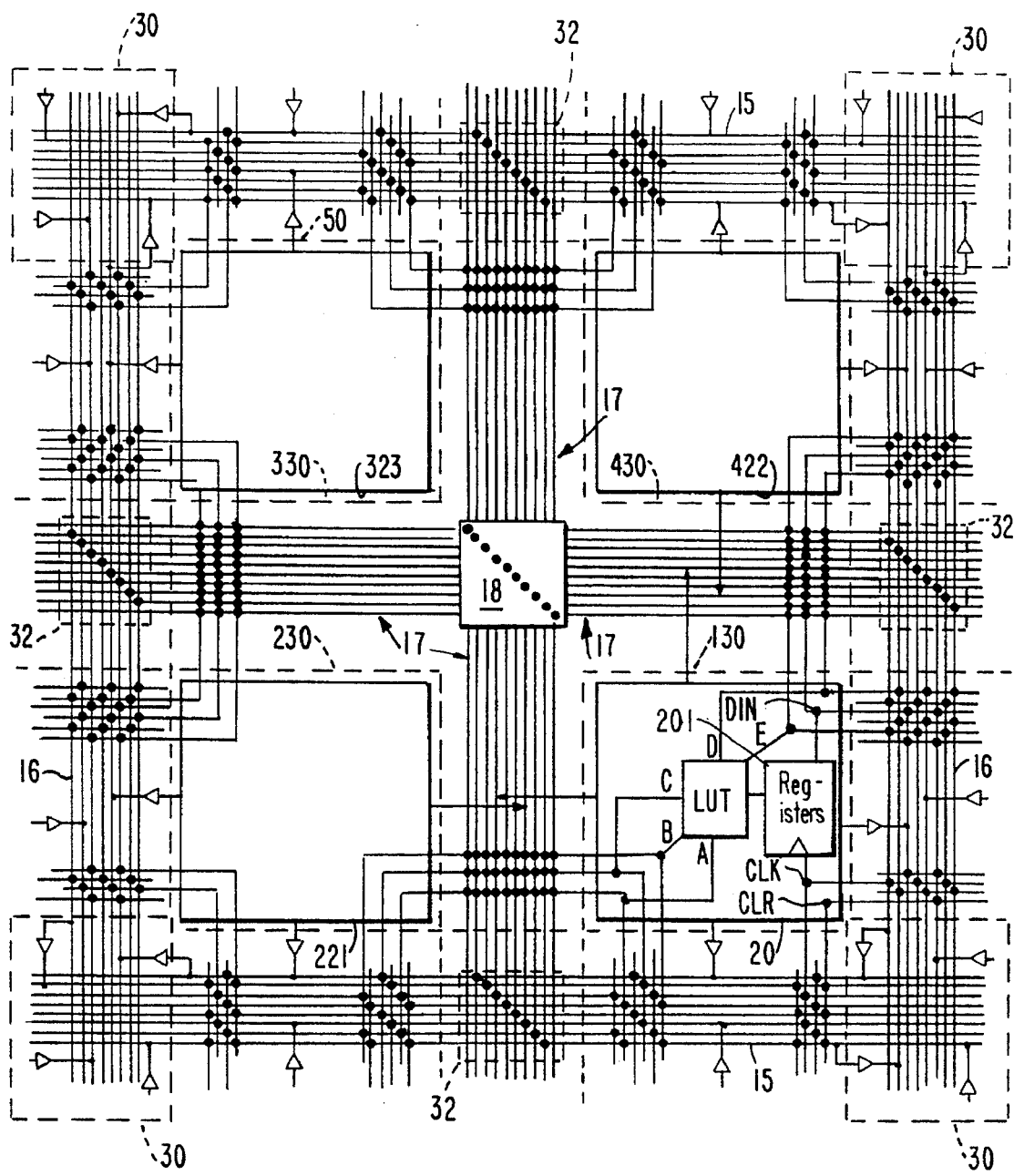
FIG. 5 is a schematic block diagram of another representative port on of the device of FIG. 1.

FIG. 5 is a view similar to FIG. 3, but centered on one of switchboxes 18. The programmable logic region at the lower right is programmable logic region 20 of logic subset 130. The programmable logic region at the lower left is programmable logic region 221 of logic subset 230, which is one of logic subsets 13 adjacent logic subset 130. The programmable logic region at the upper left is programmable logic region 323 of logic subset 330, which is one of logic subsets 13 adjacent logic subset 130. The programmable logic region at the upper right is programmable logic region 422 of logic subset 430, which is one of logic subsets 13 adjacent logic subset 130. Thus, in addition to logic subset 130 which is defined by the diagonal direct connections among its programmable logic regions 20–23 (and similarly defined logic subsets 230, 330, 430), a different type of logic subset 50, defined as the four programmable logic regions 12 (20, 221, 323, 422) sharing a single switchbox 18, can also be considered. Thus, while FIGS. 2–4 make it appear (because the view of FIGS. 2–4 does not take into account sharing of switchboxes 18 by different logic subsets 13) that there are four switchboxes 18 for every logic subset 13—or one per programmable logic region 12, FIG. 5 shows that there is in fact preferably about one switchbox 18 for every four programmable logic regions 12.

Thus it is seen that a programmable logic array device architecture that takes advantage of the greater availability of semiconductor devices having three metallization layers, a programmable logic array device architecture that relies on fewer programmable resources to achieve connections between programmable logic regions thereof, and such a device having a greater number of global conductors, are provided. One skilled in the art will appreciate that the present invention can be practiced by other than the described embodiments, which are presented for purposes of illustration and not of limitation, and the present invention is limited only by the claims which follow.

What is claimed is:

1. A programmable logic array device having first and second substantially orthogonal array dimensions and comprising:

a plurality of regions of programmable logic arranged in rows and columns substantially along said first and second orthogonal array dimensions, each of said regions having a plurality of terminals comprising a plurality of inputs and at least one output, and producing an output signal on said output which is a programmable function of an input signal applied to said inputs of said region, said regions being grouped into logic subsets, each of said logic subsets comprising a plurality of said regions, each of said regions belonging to only one of said logic subsets;

a first group of conductors for conducting signals to, from and among said logic subsets, each conductor in said first group of conductors extending along substantially the entire length of one of said first and second orthogonal array dimensions;

a second group of conductors, each of said subsets having at least one conductor of said second group of conductors associated therewith, for conducting signals to, from and among said regions in said logic subset;

a third group of conductors, each of which conveys signals directly from one of said regions in one of said logic subsets to another of said regions in said one of said logic subsets;

a first group of connectors for programmably selectively connecting any conductor in one of said first, second and third groups of conductors to at least one of (a) an input to, and (b) an output of, one of said regions, at least one connector in said first group of connectors connecting at least one conductor in said first group of conductors directly to an input of one of said regions; and a second group of connectors for programmably selectively connecting conductors in said first group of conductors to other conductors in said first and second groups of conductors.

2. The programmable logic array device of claim 1 wherein those of said conductors in said second group of conductors that are associated with a particular one of said logic subsets circumscribes said particular one of said logic subsets.

3. The programmable logic array device of claim 1 wherein said first group of conductors comprises a plurality of horizontal first conductors extending substantially parallel to said rows, and a plurality of vertical first conductors extending substantially parallel to said columns.

4. The programmable logic array device of claim 1 wherein each of said logic subsets comprises:

at least one set of said plurality of horizontal first conductors; and at least one set of said plurality of vertical first conductors.

5. The programmable logic array device of claim 4 wherein each of said regions has a first group of terminals each of which has access to at least one said set of said first group of conductors, each of said terminals of said first group of terminals being for one of (a) input and (b) output.

6. The programmable logic array device of claim 5 wherein each of said regions has a second group of terminals each of which has access to at least the other said set of said first group of conductors, each of said terminals of said second group of terminals being for one of (a) input and (b) output.

7. The programmable logic array device of claim 6 wherein:

said plurality of inputs of each said region comprises register inputs selected from the group consisting of clocks, presets, clears and combinations thereof; and said register inputs have access to both said sets of said first group of conductors.

8. The programmable logic array device of claim 5 wherein said first group of connectors comprises at least one programmable first connection between said at least one output of said region and said at least one set of said first conductors.

9. The programmable logic array device of claim 8 wherein said programmable first connection is buffered.

10. The programmable logic array device of claim 9 wherein said buffered programmable first connection comprises a three-state device.

11. The programmable logic array device of claim 4 wherein, in at least one of said logic subsets, said plurality of horizontal first conductors and said plurality of vertical first conductors intersect in a single first conductor intersection.

12. The programmable logic array device of claim 11 wherein said second group of connectors comprises at least one programmable second connection between at least one of said horizontal first conductors and one of said vertical first conductors in said first conductor intersection.

13. The programmable logic array device of claim 12 wherein said at least one programmable second connection is buffered.

14. The programmable logic array device of claim 13 wherein said at least one buffered programmable second connection comprises a three-state device.

15. The programmable logic array device of claim 1 wherein said second group of conductors comprises a plurality of horizontal second conductors extending substantially parallel to said rows, and a plurality of vertical second conductors extending substantially parallel to said columns.

16. The programmable logic array device of claim 15 wherein each of said logic subsets is associated with:

at least one set of said plurality of horizontal second conductors, and at least one set of said plurality of vertical second conductors; and said first group of connectors comprises:

at least one programmable second connection matrix, each said second connection matrix intersecting a plurality of said sets of second conductors associated with at least one of (a) a first one of said logic subsets, and (b) a second one of said logic subsets adjacent said first one of said logic subsets, for programmably selectively connecting at least one said second conductors in one of said sets of second conductors to a second conductor in another of said sets of second conductors.

17. The programmable logic array device of claim 16 wherein each of said regions has a first group of terminals each of which has access to at least one said set of said second group of conductors, each of said terminals of said first group of terminals being for one of (a) input and (b) output.

18. The programmable logic array device of claim 17 wherein each of said regions has a second group of terminals each of which has access to at least the other set of said second group of conductors, each of said terminals of said second group of terminals being for one of (a) input and (b) output.

19. The programmable logic array device of claim 17 wherein said first group of connectors comprises:

a fully populated matrix of programmable first connections between said at least one of said second conductors and said inputs of said region; and a fully populated matrix of programmable first connections between said at least one of said second conductors and said at least one output of said region.

20. The programmable logic array device of claim 16 wherein each of said logic subsets comprises:

at least one set of a plurality of horizontal first conductors extending substantially parallel to said rows; and at least one set of a plurality of vertical first conductors extending substantially parallel to said columns; wherein:

at least one of said sets of one of (a) said horizontal first conductors, and (b) said vertical first conductors, intersects at least one of said sets of one of (a) said vertical second conductors, and (b) said horizontal second conductors, in a first-second conductor intersection.

21. The programmable logic array device of claim 20 wherein said second group of connectors comprises at least one programmable second connection between at least one of said first conductors and one of said second conductors in said first-second conductor intersection.

22. The programmable logic array device of claim 21 said at least one programmable second connection is for driving said first conductor from said second conductor and is buffered.

23. The programmable logic array device of claim 22 wherein said at least one buffered programmable second connection for driving said first conductor from said second conductor comprises a three-state device.

24. The programmable logic array device of claim 21 wherein said second group of connectors comprises a sparsely populated matrix of programmable second connections between said first conductors and said second conductors in said first-second conductor intersection.

25. The programmable logic array device of claim 24 wherein each of said first conductors in said first-second conductor intersection is programmably selectively connectable to at least one of said second conductors in said first-second conductor intersection.

* * * * *